(12) United States Patent
McClure

(10) Patent No.: US 7,333,310 B2
(45) Date of Patent: Feb. 19, 2008

(54) ESD BONDING PAD

(75) Inventor: David Charles McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 429 days.

(21) Appl. No.: 11/013,123

(22) Filed: Dec. 15, 2004

(65) Prior Publication Data

US 2005/0134240 A1    Jun. 23, 2005

Related U.S. Application Data

(60) Provisional application No. 60/530,736, filed on Dec. 18, 2003.

(51) Int. Cl.
H02H 3/22 (2006.01)
(52) U.S. Cl. .................................... 361/56; 361/111
(58) Field of Classification Search ............ 361/56–58, 361/91.1, 111; 257/355, 360
See application file for complete search history.

(56) References Cited

U.S. PATENT DOCUMENTS

| | | | | |
|---|---|---|---|---|
| 4,745,450 A | * | 5/1988 | Hartranft et al. ........... 257/360 |
| 4,802,054 A | * | 1/1989 | Yu et al. ..................... 361/56 |
| 4,839,768 A | * | 6/1989 | Daniele et al. .............. 361/56 |
| 4,868,705 A | * | 9/1989 | Shiochi et al. .............. 361/56 |
| 5,535,084 A | * | 7/1996 | Nakayama ................... 361/56 |
| 6,507,232 B2 | * | 1/2003 | Matsui ...................... 327/337 |
| 7,170,727 B2 | * | 1/2007 | Richardson ................. 361/56 |

* cited by examiner

*Primary Examiner*—Michael Sherry
*Assistant Examiner*—Danny Nguyen
(74) *Attorney, Agent, or Firm*—Lisa K. Jorgenson; Renee Michelle Leveque

(57) ABSTRACT

A bonding pad arrangement for an integrated circuit includes a bonding pad fabricated on a bonding area to enable bonding. A first ESD resistor is fabricated adjacent the bonding area, and at least a second ESD resistor is fabricated adjacent the first ESD resistor and the bonding area. The bonding pad extends beyond the bonding area to connect to the first ESD resistor and to the at least second ESD resistor, thereby providing at least two input ESD circuits for at least one current consuming electronic circuit from the single bonding pad.

28 Claims, 5 Drawing Sheets

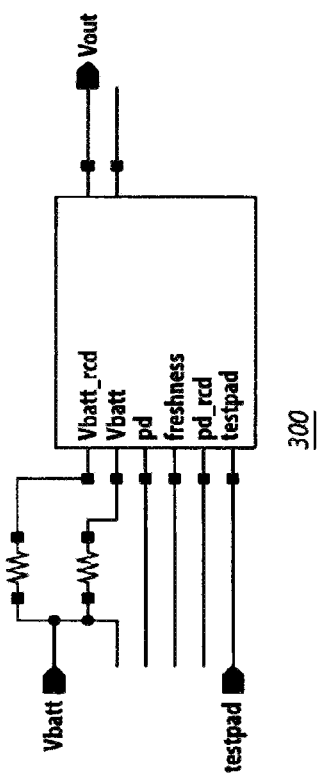
FIG. 3 (Prior Art)
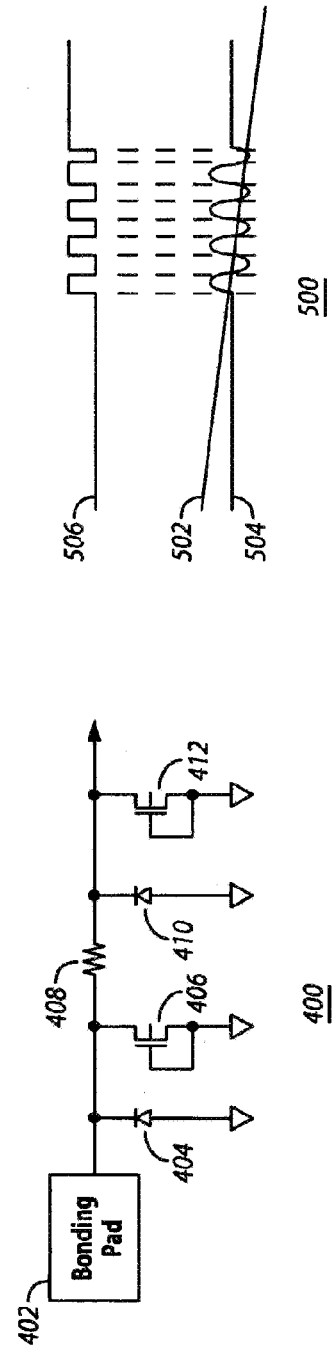
FIG. 5 (Prior Art)
FIG. 4 (Prior Art)

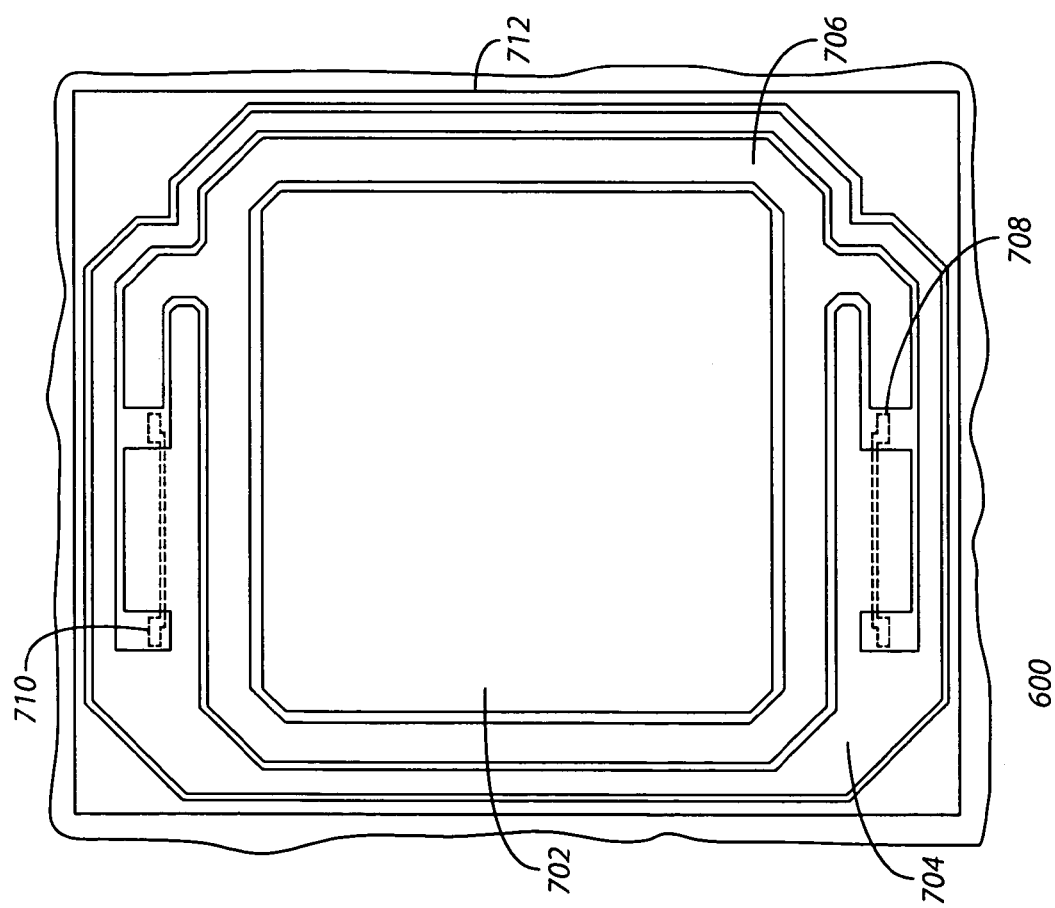

ESD BONDING PAD

BENEFIT CLAIM OF PRIOR-FILED APPLICATION

This application claims priority benefit of U.S. Provisional Patent Application Ser. No. 60/530,736, filed Dec. 18, 2003, entitled "Battery Bondpad ESD Structure", which is hereby incorporated herein by reference.

BACKGROUND

A problem can exist in a zero-power device, such as an SRAM (static random access memory) that operates from a power supply, which regularly supplies power to the device, and then is required to operate from a battery when a power supply failure is detected. The problem is often isolated to the power supply detection circuit which upon detecting the power supply failure, can cause multiple switchovers between the power supply output and the battery output as the power supply output voltage decays.

An example of such a power supply voltage detection circuit is shown in FIG. 1, which shows an electrical diagram of a comparator 100 that compares the power supply output voltage, Vcc, to the battery voltage, Vbat. For purposes of the description to follow below, the nominal power supply voltage is 5 volts and the nominal battery voltage is 3 volts. When the comparator 100 detects that Vbat>Vcc, the comparator 100 provides a signal to the battery switching logic described below to switch the source of power from the power supply to the battery. Since there are many other comparator configurations that can be utilized as a power supply detection circuit other than that shown in FIG. 1, a complete description of the operation of the comparator 100 of FIG. 1 is not being provided herein.

FIG. 2 is an electrical diagram of the battery switching logic 200 used to switch power to the SRAM from the power supply to the battery. The battery switching logic 200 of FIG. 2 utilizes large geometry p-channel switches identified as M1 and M2. M1 and M2 are used to switch power to an SRAM connected to output Vout, shown in the block diagram 300 of FIG. 3, from an internal power source Vcc, and an external power source Vbat. M1 is used to switch the external power source Vbat to Vout, and M2 is used to switch the internal power source Vcc to Vout. When M1 and M2 switch, i.e. one turns on while the other turns off, oscillation between selecting the internal power source Vcc and the external power source Vbat can occur. The problem is due to the capacitance of the large geometry p-channel switches that can combined be about 30 to 40 pF (pico-farads) as will be described below. Since there are many other battery switching logic configurations that can be utilized a more comprehensive description of the operation of the battery switching logic 200 is not being provided herein.

FIG. 4 is an electrical diagram showing an input ESD (electrostatic discharge) circuit 400 utilized on integrated circuits having inputs and/or outputs that are sensitive to electrostatic discharge damage. A bonding pad 402 is connected to the cathode terminal of a substrate diode 404, to the anode terminal (drain terminal) of an n-channel diode-connected MOS transistor 406, and to one terminal of an ESD resistor 408. The anode terminal of substrate diode 404 and the cathode terminal (gate and source terminals) of n-channel diode-connected MOS transistor 406 are connected to Vss (ground). The second terminal of the ESD resistor 408 is connected to the cathode terminal of a substrate diode 410, to the anode terminal (drain terminal) of an n-channel diode-connected MOS transistor 412, and to the comparator 100 input and switching circuit 200 input being supplied the battery voltage through bonding pad 402. The anode terminal of substrate diode 410 and the cathode terminal (gate and source terminals) of n-channel diode-connected MOS transistor 412 are connected to Vss (ground). The ESD resistor 408 has a typical resistance of from 100 to 300 Ω (ohms). Positive going and negative going voltage spikes created by static electricity are effectively suppressed by the typical input ESD circuit 400 in a manner well known in the art.

The battery voltage Vbat is supplied to both the comparator 100 and the switching logic 200 through the bonding pad 402 and the input ESD circuit 400. The process of charging, as an example M2 high, resulted in a significant voltage drop across the ESD resistor 408. The resultant voltage drop at the input of the comparator 100 reduced the detected Vbat voltage below the current Vcc voltage, causing the switching logic 200 to switch back to the internal power supply.

The effect of this switching back and forth is shown in FIG. 5 which is a graph 500 depicting the operation of the comparator 100 and switching logic 200. The vertical axis represents voltage and the horizontal axis represents time. Waveform 502 depicts the power supply voltage Vcc decaying because of a power supply failure and approaching the battery voltage Vbat. Waveform 504 depicts the resultant voltage drop at the output of the input ESD circuit 400, corresponding to the input to comparator 100, when Vbat=Vcc and the comparator 100 triggers the battery switching circuit 200, and thereafter when Vbat>Vcc and the battery switching circuit 200 is retriggered. Waveform 506 depicts the output of the switching circuit Vout. After having switched back to the internal power supply, the power supply output voltage continues to slump, the comparator 100 again detects Vbat>Vcc, and the switching logic 200 switches to the external battery. The oscillation continues for several hundred micro-seconds until the detected value of Vbat at the output of the input ESD circuit 400 no longer falls below the detected value of Vcc.

The problem described above is generated because the output Vout provides approximately 100 mA (milli-amperes) of current to the SRAM, the internal power required to power the comparator 100 and the battery switching circuit 200 is between 1 and 5 mA while switching, and settles to less than 100 nA (nano-amperes) after switching, as compared to the current required to the input of the comparator, which is less than 1 nA. Prior art methods of overcoming the problems noted above often included separating the detection circuit from other circuits, so as to provide multiple bonding pads and a separate input ESD circuits for any voltage sensitive circuit function. Because most integrated circuit layouts are constrained by size and the number of bonding pads that can be provided, this solution is not always cost effective.

What is therefore needed is a means for supplying more than one circuit having voltage sensitive and non-voltage sensitive functions and sharing a common input using a single bonding pad. What is also needed is a space efficient method of providing multiple input ESD circuits for the circuits connected to the common bonding pad.

BRIEF DESCRIPTION OF THE DRAWINGS

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description, like reference numerals are used to describe the same, similar or corresponding parts in the several views of the drawings.

FIG. 3 is an electrical block diagram of the prior art battery switching circuit.

FIG. 4 is an electrical diagram of a prior art input ESD circuit.

FIG. 5 is a graph depicting the operation of the prior art battery switching circuit.

FIG. 7 is an layout diagram of the bonding pad arrangement providing multiple input ESD circuits in accordance with certain embodiments of the present invention.

FIG. 8 is a graph depicting the operation of a battery switching circuit connected to the bonding pad arrangement providing multiple input ESD circuits in accordance with certain embodiments of the present invention.

DETAILED DESCRIPTION

Figure 1:
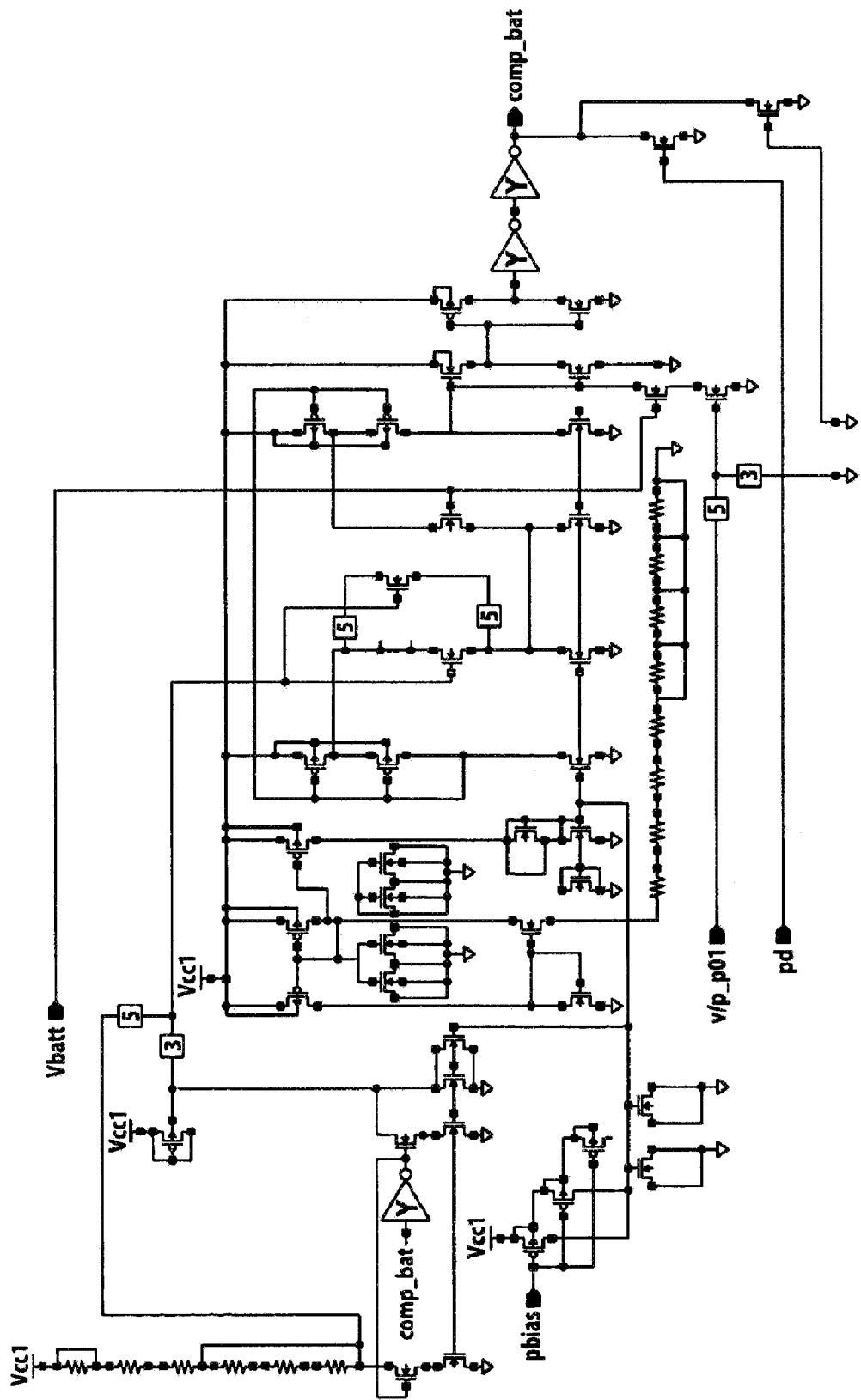
FIG. 1 is an electrical diagram of a prior art power supply voltage detection circuit.
Figure 2:
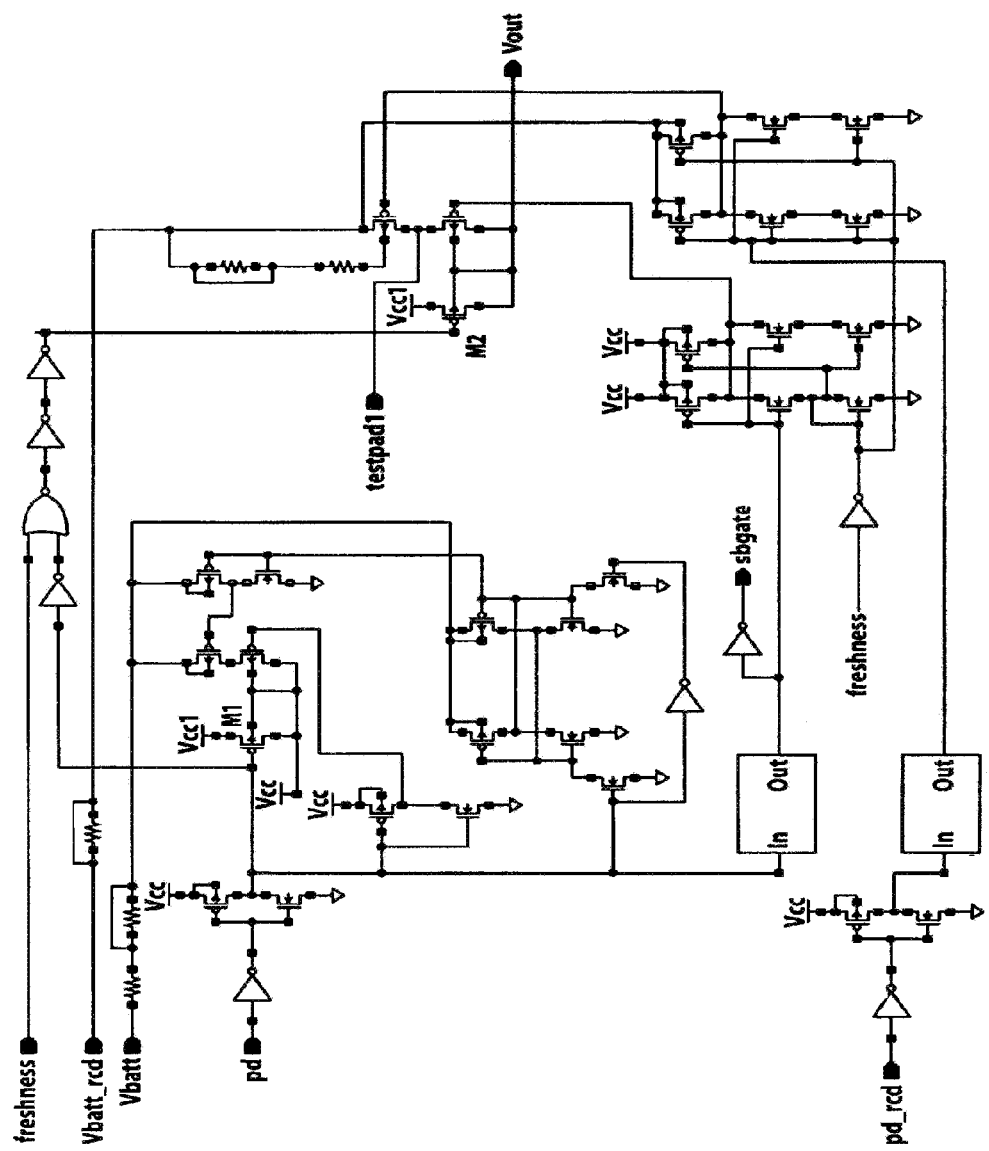
FIG. 2 is an electrical diagram of a prior art battery switching circuit.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

Figure 6:
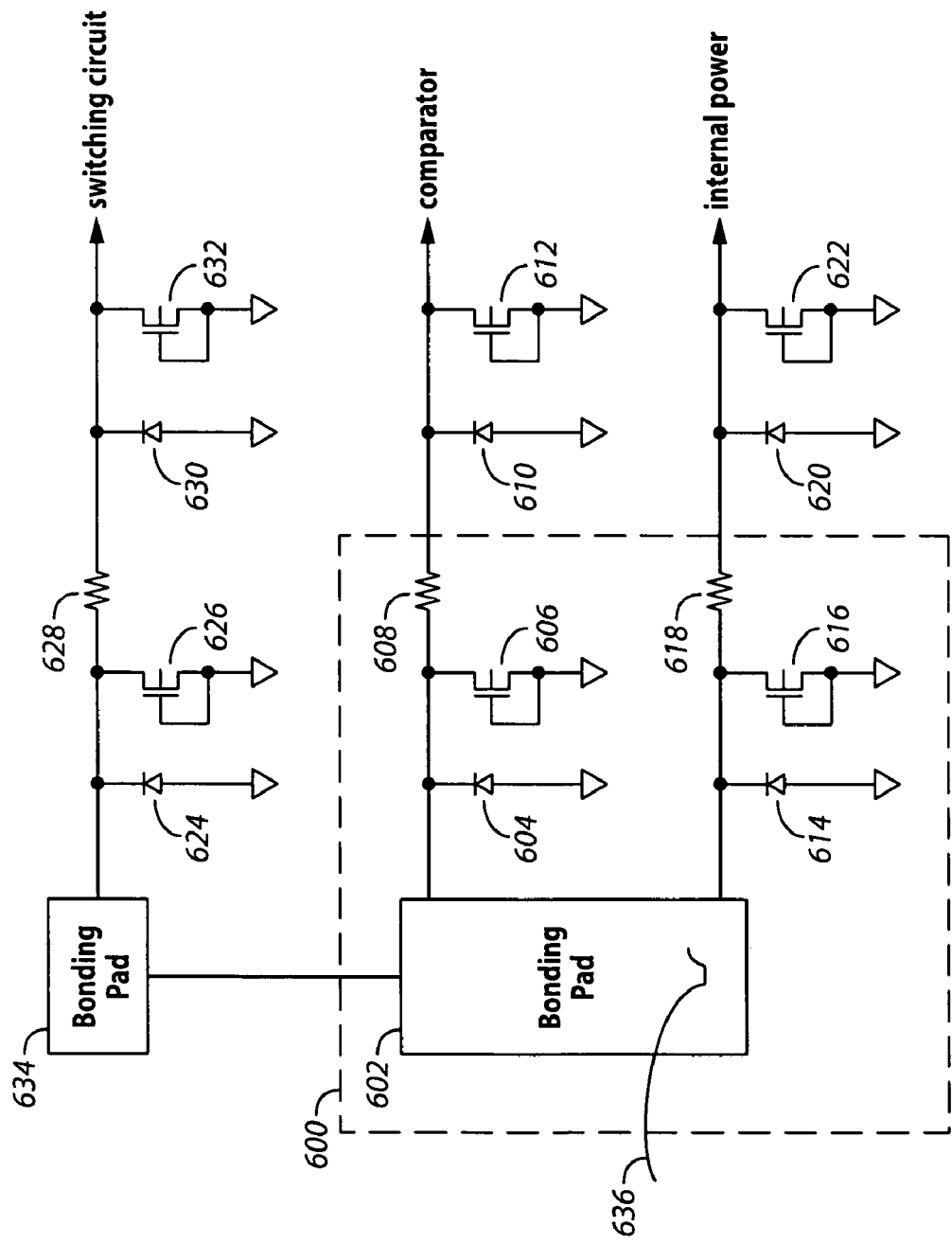
FIG. 6 is an electrical diagram of a bonding pad arrangement 600 providing multiple input ESD circuits in accordance with certain embodiments of the present invention.

FIG. 6 is an electrical diagram of an improved bonding pad arrangement 600 providing multiple input ESD circuits in accordance with the present invention. The bonding pad arrangement 600 includes a bonding pad 602 defining a bonding area that is used to connect the battery output to the power supply voltage detection circuit and to supply power for other circuits located on the integrated circuit.

A second bonding pad 634 is shown in FIG. 6 that is used to connect the battery output to the battery switching circuit that has also been fabricated on the integrated circuit. Bonding pad 634 is electrically connected to bonding pad 602 and provides the battery output to the battery switching circuit. Alternatively, bonding pad 634 can be eliminated in accordance with the present invention, and the substrate diode 624, the n-channel diode-connected MOS transistor 626, an ESD resistor 628 included within the improved bonding pad arrangement 600 as will be described below.

The connection between the bonding pad 602 and the substrate or circuit board is through a wire bond 636 using aluminum wire bonding or gold ball bonding techniques in a manner well known to one of ordinary skill in the art and provides the battery input to the integrated circuit. In addition to wire bonding, solder bumps may be used to obtain bonding.

Included within the layout of the bonding pad 602 in accordance with the present invention are portions of multiple input ESD circuits, including but not limited to a substrate diode 604 an n-channel diode-connected MOS transistor 606, an ESD resistor 608, a substrate diode 614 an n-channel diode-connected MOS transistor 616, and an ESD resistor 618, as will be described further below in FIG. 7.

The bonding pad 602 is connected to the cathode terminal of the substrate diode 604, to the anode terminal (drain terminal) of an n-channel diode-connected MOS transistor 606, and to one terminal of the ESD resistor 608. The anode terminal of substrate diode 604 and the cathode terminal (gate and source terminals) of n-channel diode-connected MOS transistor 606 are connected to Vss (ground). The second terminal of the ESD resistor 608 is connected to the cathode terminal of a substrate diode 610, to the anode terminal (drain terminal) of an n-channel diode-connected MOS transistor 612, and to the input of a comparator, such as the prior art comparator 100. The anode terminal of substrate diode 610 and the cathode terminal (gate and source terminals) of n-channel diode-connected MOS transistor 612 are connected to Vss (ground). The ESD resistor 608 has a typical resistance of from 100 to 300 Ω (ohms).

The bonding pad 602 is also connected to the cathode terminal of the substrate diode 614, to the anode terminal (drain terminal) of an n-channel diode-connected MOS transistor 616, and to one terminal of the ESD resistor 618. The anode terminal of substrate diode 614 and the cathode terminal (gate and source terminals) of n-channel diode-connected MOS transistor 616 are connected to Vss (ground). The second terminal of the ESD resistor 618 is connected to the cathode terminal of a substrate diode 620, to the anode terminal (drain terminal) of an n-channel diode-connected MOS transistor 622, and to an input providing internal power to the integrated circuit. The anode terminal of substrate diode 620 and the cathode terminal (gate and source terminals) of n-channel diode-connected MOS transistor 622 are connected to Vss (ground). The ESD resistor 618 has a typical resistance of from 100 to 300 Ω (ohms).

Bonding pad 634 is connected to the cathode terminal of the substrate diode 624, to the anode terminal (drain terminal) of an n-channel diode-connected MOS transistor 626, and to one terminal of the ESD resistor 628. The anode terminal of substrate diode 624 and the cathode terminal (gate and source terminals) of n-channel diode-connected MOS transistor 626 are connected to Vss (ground). The second terminal of the ESD resistor 628 is connected to the cathode terminal of a substrate diode 630, to the anode terminal (drain terminal) of an n-channel diode-connected MOS transistor 632, and to an input providing power to a battery switching circuit, such as battery switching circuit 200. The anode terminal of substrate diode 630 and the cathode terminal (gate and source terminals) of n-channel diode-connected MOS transistor 632 are connected to Vss (ground). The ESD resistor 628 has a typical resistance of from 100 to 300 Ω (ohms).

The layout of the bonding pad arrangement 600 is shown in FIG. 7. The structures of FIG. 7 represent the active layers of the integrated circuit forming the bonding pad arrangement 600 in accordance with the present invention. The bonding pad arrangement 600 includes a wire bonding area 702 within which the wire bond 636 is attached to the bonding pad metallization 712. Surrounding the wire bonding area 702 is a polysilicon resistor 704 corresponding to ESD resistor 608 and a polysilicon resistor 706 corresponding to ESD resistor 618; please note that in addition to the ESD resistor surrounding the bonding area, it could be fabricated adjacent to it. The n-channel diode-connected MOS transistor 606 is represented by structure 708, while the n-channel diode-connected MOS transistor 616 is represented by structure 708. The bonding pad metallization 602 directly connects to the ESD resistor 608 supplying current to the comparator 100 and the ESD resistor 618 supplying power to the internal curcuits as shown in FIG. 5 so the voltage drop induced by the current in one ESD resistor does not influence the voltage drop induced by a second current in a second ESD resistor. It will be appreciated by one of ordinary skill in the art, that additional ESD resistors can be fabricated in a manner described above, whereby addition polysilicon resistors are formed around the polysilicon resistor 704 and polysilicon resistor 706, thereby providing power to additional circuits from a single bonding pad.

FIG. 8 is a graph 800 depicting the operation of a comparator 100 and battery switching circuit 200 connected to the bonding pad arrangement 600 providing multiple input ESD circuits in accordance with the present invention. The vertical axis represents voltage and the horizontal axis represents time. Waveform 502 depicts the power supply voltage Vcc decaying because of a power supply failure and approaching the battery voltage Vbat. Waveform 804 depicts the resultant voltage drop at the output of the input ESD circuit of the bonding pad arrangement 600, corresponding to the input to comparator 100, when Vbat=Vcc and the comparator triggers the battery switching circuit 200. It will be noted the interaction between the comparator 100 and battery switching circuit 200 has been eliminated. Waveform 806 depicts the output of the switching circuit Vout. As shown the battery switching circuit 200 cleanly switches when Vbat>Vcc.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

I claim:

1. A bonding pad arrangement for an integrated circuit comprising:
    a bonding pad fabricated on an integrated circuit package bonding area to enable bonding;
    a first ESD resistor fabricated adjacent the integrated circuit package bonding area; and
    at least a second ESD resistor electrically coupled to the first ESD resistor and the integrated circuit package bonding area,
    a first diode pair having first terminals coupled between said bonding pad and a first terminal of said first ESD resistor and second terminals coupled to a circuit ground; and
    at least a second diode pair having first terminals coupled between said bonding pad and a first terminal of said at least second ESD resistor and second terminals coupled to the circuit ground,
    wherein said bonding pad is coupled to said first ESD resistor and to said at least a second ESD resistor, thereby providing at least two input ESD circuits for at least one current consuming electronic circuit from the bonding pad and wherein said bonding pad extends beyond said bonding area to further connect said first diode pair and said at least second diode pair to said bonding pad.

2. The bonding pad arrangement for an integrated circuit according to claim 1 wherein said first diode pair comprises a first substrate diode and a first n-channel diode-connected MOS transistor, and
    said second diode pair comprises a second substrate diode and a second n-channel diode-connected MOS transistor.

3. The bonding pad arrangement for an integrated circuit according to claim 1 wherein
    a second terminal of said first ESD resistor further couples to a third diode pair having first terminals coupled between to said first ESD resistor and second terminals coupled to the circuit ground, and
    a second terminal of said second ESD resistor further couples to a fourth diode pair having first terminals coupled between to said at least second ESD resistor and second terminals coupled to the circuit ground.

4. The bonding pad arrangement for an integrated circuit according to claim 1 wherein said second terminal of said first ESD resistor provides current to a first circuit requiring a first input current.

5. The bonding pad arrangement for an integrated circuit according to claim 4 wherein said first circuit is voltage sensitive.

6. The bonding pad arrangement for an integrated circuit according to claim 1 wherein said second terminal of said at least second ESD resistor provides current to a second circuit requiring a second input current.

7. The bonding pad arrangement for an integrated circuit according to claim 6 wherein said second circuit is voltage sensitive.

8. The bonding pad arrangement for an integrated circuit according to claim 1, wherein the integrated circuit is fabricated using MOS technology.

9. The bonding pad arrangement for an integrated circuit according to claim 1, wherein the bonding pad is a wire bonding pad, the integrated circuit package bonding area is a wire integrated circuit package bonding area, and the wire bonding pad is fabricated on the wire integrated circuit package bonding area.

10. The bonding pad arrangement for an integrated circuit according to claim 9, wherein the wire integrated circuit package bonding area is covered with a metal.

11. The bonding pad arrangement for an integrated circuit according to claim 1, wherein the at least second ESD resistor is fabricated surrounding the first ESD resistor and the integrated circuit package bonding area.

12. The bonding pad arrangement for an integrated circuit according to claim 1, wherein the bonding area is a wire bonding metal that extends beyond said integrated circuit package bonding area to couple to said first ESD resistor and to said at least second ESD resistor.

13. The bonding pad arrangement for an integrated circuit according to claim 1, wherein said bonding pad is coupled to said first ESD resistor and to said at least second ESD resistor, to provide at least two input ESD circuits for at least two current consuming electronic circuits from the bonding pad.

14. The bonding pad arrangement for an integrated circuit according to claim 1, wherein at least one of said first ESD resistor and said at least second ESD resistor comprises polysilicon.

15. The bonding pad arrangement for an integrated circuit according to claim 1, wherein at least one of said first ESD resistor and said at least second ESD resistor comprises diffusion.

16. The bonding pad arrangement for an integrated circuit according to claim 1, wherein at least one of said first ESD resistor and said at least second ESD resistor comprises metal.

17. An integrated circuit fabricated with a voltage sensitive circuit and a non-voltage sensitive circuit having inputs coupled to a common bonding pad, the integrated circuit comprising:
- a bonding pad fabricated on a bonding area to enable bonding,
- a first input ESD circuit having a first ESD resistor fabricated adjacent the bonding area for supplying an input to the voltage sensitive circuit, and
- at least a second input ESD circuit having a second ESD resistor fabricated adjacent the first ESD resistor and the bonding area for supplying an input to the non-voltage sensitive circuit,
- wherein said bonding pad extends beyond said bonding area to connect to said first ESD resistor and to said second ESD resistor, thereby providing at least two input ESD circuits a first ESD input circuit coupling to said voltage sensitive circuit and at least a second input ESD circuit coupling to said non-voltage sensitive circuit from the bonding pad,
  - said first input ESD circuit further comprises a first diode pair having first terminals coupled between said bonding pad and a first terminal of said first ESD resistor and second terminals coupled to a circuit ground, and
  - said at least second input ESD circuit further comprises a second diode pair having first terminals coupled between said bonding pad and a first terminal of said at least second ESD resistor and second terminals coupled to the circuit ground,
- wherein said bonding pad extends beyond said bonding area to further connect said first diode pair and said at least second diode pair to said bonding pad.

18. The integrated circuit according to claim 17 wherein said first diode pair comprises a first substrate diode and a first n-channel diode-connected MOS transistor, and said second diode pair comprises a second substrate diode and a second n-channel diode-connected MOS transistor.

19. The integrated circuit according to claim 17 wherein said first ESD circuit further comprises a third diode pair having first terminals coupled to a second terminal of said first ESD resistor and second terminals coupled to the circuit ground, and said second ESD circuit further comprises a fourth diode pair having first terminals coupled to a second terminal of said second ESD resistor and second terminals coupled to the circuit ground.

20. The integrated circuit according to claim 17, wherein the integrated circuit is fabricated using MOS technology.

21. The bonding pad arrangement for an integrated circuit according to claim 17, wherein the bonding pad is a wire bonding pad, the integrated circuit package bonding area is a wire integrated circuit package bonding area, and the wire bonding pad is fabricated on the wire integrated circuit package bonding area.

22. The bonding pad arrangement for an integrated circuit according to claim 21, wherein the wire integrated circuit package bonding area is covered with a metal.

23. The bonding pad arrangement for an integrated circuit according to claim 17, wherein the at least second ESD resistor is fabricated surrounding the first ESD resistor and the integrated circuit package bonding area.

24. The bonding pad arrangement for an integrated circuit according to claim 17, wherein the bonding area is a wire bonding metal that extends beyond said integrated circuit package bonding area to couple to said first ESD resistor and to said at least second ESD resistor.

25. The bonding pad arrangement for an integrated circuit according to claim 17, wherein said bonding pad is coupled to said first ESD resistor and to said at least second ESD resistor, to provide at least two input ESD circuits for at least two current consuming electronic circuits from the bonding pad.

26. The bonding pad arrangement for an integrated circuit according to claim 17, wherein at least one of said first ESD resistor and said at least second ESD resistor comprises polysilicon.

27. The bonding pad arrangement for an integrated circuit according to claim 17, wherein at least one of said first ESD resistor and said at least second ESD resistor comprises diffusion.

28. The bonding pad arrangement for an integrated circuit according to claim 17, wherein at least one of said first ESD resistor and said at least second ESD resistor comprises metal.

* * * * *